(12) United States Patent
Gregor et al.

(10) Patent No.: US 6,359,339 B1
(45) Date of Patent: Mar. 19, 2002

(54) MULTI-LAYERED METAL SILICIDE RESISTOR FOR SI IC'S

(75) Inventors: Richard W. Gregor, Winter Park, FL (US); Isik C. Kizilyalli, Millburn, NJ (US); Sailesh M. Merchant, Orlando, FL (US); Jaseph R. Radosevich, Orlando, FL (US); Pradip K. Roy, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/480,224

(22) Filed: Jan. 10, 2000

Related U.S. Application Data

(60) Provisional application No. 60/115,525, filed on Jan. 12, 1999.

(51) Int. Cl.[7] ............................................. H01L 23/48
(52) U.S. Cl. ..................... 257/757; 257/384; 257/755; 257/536

(58) Field of Search .................................. 257/536, 384, 257/755, 757

Primary Examiner—Fetsum Abraham

(57) ABSTRACT

The present invention provides a unique a resistor formed on a semiconductor substrate. The resistor preferably comprises a first resistor layer that includes a first metal silicide, such as tungsten silicide, and nitrogen and that is formed on the substrate. The first layer has a first thickness and a concentration of nitrogen incorporated therein. The nitrogen concentration may be varied to obtain a desired resistive value of the resistor. Thus, depending on the concentration of nitrogen, a wide range of resistive values may be achieved. The resistor further comprises a second resistor layer with a second thickness that includes a second metal silicide and that is formed on the first resistor layer. Thus, the present invention provides a metal silicide-based resistor having nitrogen incorporated therein which allows the resistance of the resistor to be tailored to specific electrical applications. Yet at the same time, the resistor is far less susceptible to temperature and voltage variation than conventional diffused resistors and, thereby, provides a more precise resistor.

18 Claims, 4 Drawing Sheets

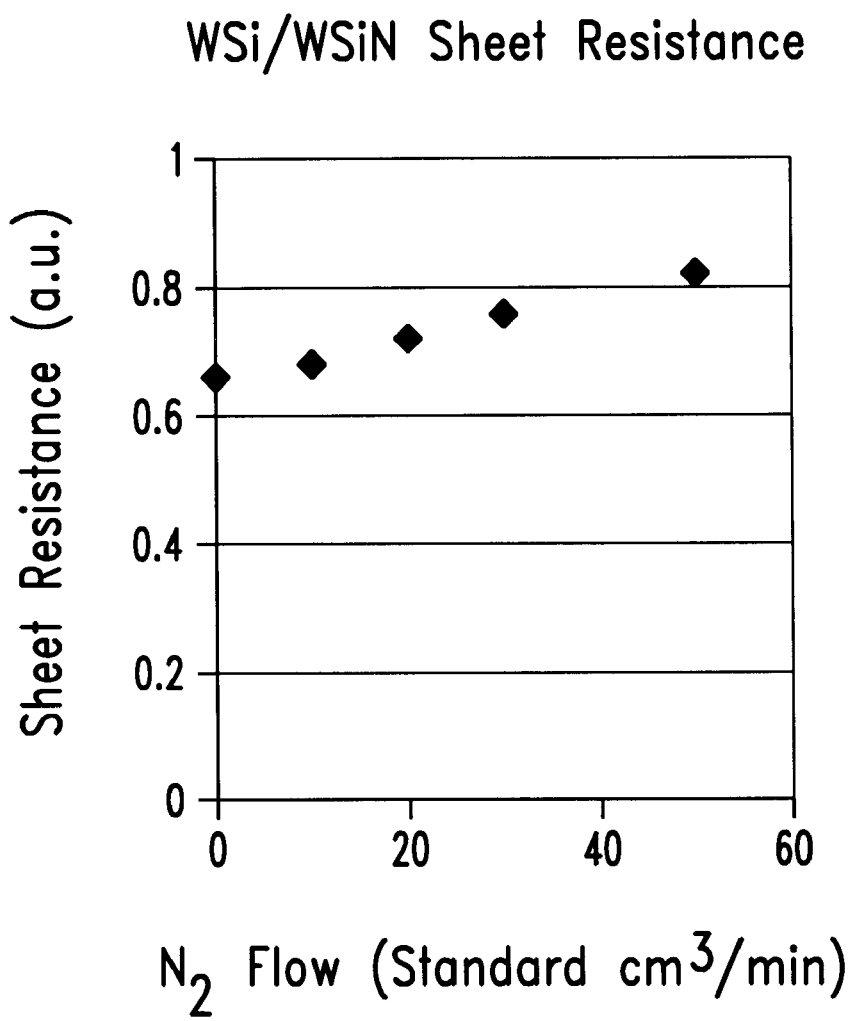

MULTI-LAYERED METAL SILICIDE RESISTOR FOR SI IC'S

CROSS-REFERENCE TO PROVISIONAL APPLICATION

This application claims the benefit of U.S. Provisional Application No. 60/115,525 entitled "Multi-layered WSI/WSIN/Poly (optional) Resistor for SI IC's," to Kizilyalli, et. al., filed on Jan. 12, 1999, which is commonly assigned with the present invention and incorporated herein by reference as if reproduced herein in its entirety.

TECHNICAL FIELD OF THE INVENTION

The present invention is directed, in general, to a resistor and, more specifically, to a resistor for use in an analog circuit and a method of manufacturing such a resistor.

BACKGROUND OF THE INVENTION

The desire for clearer and more efficient means of signal transmission and reception has prompted a rapid movement toward the use of digital circuits within various transceiver devices, such as digital mobile phones. One industry that uses such devices is the telecommunications industry, which employs integrated circuits in conjunction with analog-to-digital and digital-to-analog converters with its devices. These converters perform a vital function, by converting signals into their proper analog or digital format. A critical element of the analog device is a series of resistors that enables the analog device to precisely perform the conversion. Ironically, however, these very resistors are often the source of reduced reception and transmission quality. As it is well known, for an analog circuit to function properly, a very precise and consistent resistance value is required. If the value of the resistance changes in some way, the device's transmission or reception quality is diminished, which can result in signal break up or signal distortion.

Due to the large demand for high quality transmission and reception devices, the semiconductor industry has developed methods of manufacturing analog circuits and incorporating them into or associating them with integrated digital circuits. As previously mentioned, analog circuits require a resistor containing a precise resistance value. Moreover, it is highly desirable that resistors can be manufactured to have predetermined or tailor-made resistance values for differing applications. It is very important, however, that the resistance remains substantially constant through various temperatures and operating voltages. Thus, resistors that have a predetermined resistance and that are made of materials having low temperature and voltage coefficients are desired to accommodate the precision needed in manufacturing analog circuits.

One such resistor that is commonly used in analog circuits is the diffused resistor. Diffused resistors are resistors that normally comprise a poly silicon (Poly-Si) or silicon (Si) material and that have a dopant diffused therein to give it the desired resistance. Such resistors are doped to achieve the desired resistance value, which is controlled by the length and width of the resistor used, depth of diffusion and the resistivity of the dopant used. The use of diffused resistors is popular because of their compatibility with the remainder of the semiconductor manufacturing process. That is, they can be formed at the same time as the other circuit elements, and hence, do not add to the fabrication cost. Furthermore, they are desirable because they may be tailored to the space available and the resistivity needed.

Diffused resistors are not without their problems, however. For example, the resistance value of diffused resistors can change as the result of subsequent processing temperatures, operating temperatures or applied operating voltages. In addition, diffused resistors may also suffer from parasitic junction capacitance associated with the resistor and the underlying region, and exhibit high temperature and voltage coefficients. Thus, while a diffused resistor's resistance can be tailored for a specific application, its resistance may change depending on the temperature or operating voltage, which can lead to diminished transmission or reception quality.

To circumvent the drawbacks associated with diffused resistors, thin-film deposited resistors, such as thin metal film transistors, have also been used. The resistance of a thin-film resistor is dependent on length and area of the resistor device, and the naturally occurring resistivity of the metal being used. Thin-film resistors are often used because their resistance can be determined quickly and precisely. Additionally, they have low temperature and voltage coefficients, allowing them to maintain a precise resistance value during fluctuations in operation temperature and voltage. Furthermore, thin-film resistors exhibit smaller parasitic capacitance values than do diffused resistors. Unfortunately, however, thin-film resistors also have their drawbacks. Thin-film resistors have the resistivity value of the material of which they are made, and as such, their resistance cannot be tailored to specific applications.

Accordingly, what is needed in the art is a resistor and method of manufacturing therefore that can be precisely tailored for use in a telecommunications device and that does not experience the problems associated with the diffused and thin-film resistors. The present invention addresses these needs.

SUMMARY OF THE INVENTION

To address the above-discussed deficiencies of the prior art, the present invention provides a unique resistor formed on a semiconductor substrate. In one embodiment, the resistor comprises a first resistor layer that includes a metal silicide, such as tungsten silicide, and nitrogen and that is formed on the substrate. The first resistor layer has a first thickness and a concentration of nitrogen incorporated therein. Preferably, the concentration of nitrogen ranges from about 0.1% to about 30%. However, the nitrogen concentration may be varied to obtain a desired resistive value of the resistor. Thus, depending on the concentration of nitrogen, a wide range of resistive values may be achieved. However, in preferred embodiments, the resistive value may range from about 10 ohms/sq. to about 1000 ohms/sq. The resistor further comprises a second resistor layer with a second thickness that includes the metal silicide and that is formed on the first resistor layer.

Thus, in a broad scope, the present invention provides a metal silicide-based resistor having nitrogen incorporated therein which allows the resistance of the resistor to be tailored to specific electrical applications. Yet, at the same time the resistor is far less susceptible to temperature and voltage variation than conventional diffused resistors have been and, thereby, provides a more precise resistor.

In one embodiment, the resistance of the resistor may be varied as a function of a ratio of the first thickness to the second thickness, and relative to the nitrogen concentration. In such embodiments, the ratio may range from about 1:1 to about 1:5. In a more preferred embodiment, however, the ratio is about 1:3.

In another embodiment, the present invention provides a digital-to-analog converter. In this particular embodiment, the digital-to-analog converter includes a digital input that receives a sequence of bits representing a number, an analog conversion circuit that receives the sequence of bits from the input and associates an electrical characteristic with the sequence of bits based on values thereof. The previously described resistor, or its various above-described embodiments, forms a part of the analog conversion circuit. The resistor may be incorporated into the analog conversion circuit or separate from, but electrically connected to it. Preferably, the resistor forms part of a ladder network in the analog conversion circuit. This particular digital-to-analog circuit also includes a summing circuit, which in certain embodiments may include an operational amplifier, that adds the electrical characteristics to generate an analog value that is equivalent to the number.

In another aspect, the present invention provides an integrated circuit located on a semiconductor substrate. This particular embodiment, of course, comprises transistors formed on the substrate, interconnect structures formed on multiple levels within the integrated circuit that electrically connect to the transistors in a pattern to form the integrated circuit, the digital-to-analog converter as previously described, and a summing circuit that adds the electrical characteristics to generate an analog value that is equivalent to the number.

In yet another aspect, the present invention provides a method of forming a resistor on a semiconductor substrate. In a preferred embodiment, the method includes forming a first resistor layer including a metal silicide and nitrogen on the substrate. The first resistor layer has a first thickness and a concentration of nitrogen incorporated therein, which is dependent on a desired resistive value of the resistor. The method further includes forming a second resistor layer, which has a second thickness, including the metal silicide, as on the first resistor layer.

In one embodiment of the above-described method, a physical vapor deposition process is used to fabricate the resistor. In such embodiments, the method includes forming a first layer includes forming the first resistor layer in a presence of nitrogen gas, having a flow rate ranging from about 5 sccm to about 100 sccm. As with previous embodiments, forming the first and second resistor layers includes forming the first and second resistor layers to a thickness wherein a ratio of the first thickness to the second thickness ranges from about 1:1 to about 1:5. More preferably, the ratio is about 1:3. The metal silicide used to form the first and second resistor layers may be tungsten silicide. However, other metals known to those who are skilled in the art may also be used.

The concentration of nitrogen may vary depending on the resistor's desired resistive value. However, in a preferred embodiment, the first resistor layer may be formed such that it has a nitrogen concentration that ranges from about 0.1% to about 30%, or, it may be formed such that the resistor has a resistive value that ranges from about 10 ohms/sq. to about 1000 ohms/sq.

In another embodiment, the method may further comprise forming an integrated circuit on the substrate, including forming transistors on the substrate and forming interconnect structures on multiple levels within the integrated circuit to electrically connect the transistors in a pattern to form the integrated circuit. In yet another aspect of this particular embodiment, the method may further include forming a digital-to-analog converter that is electrically connected to the integrated circuit, including forming a digital input that receives a sequence of bits representing a number, forming an analog conversion circuit that receives the sequence of bits from the input and associates and electrical characteristic with the sequence of bits based on values thereof, the analog conversion circuit including the resistor, and forming a summing circuit that adds the electrical characteristics to generate an analog equivalent of the number.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 6 is a graph illustrating the relationship between sheet resistance and nitrogen flow.

DETAILED DESCRIPTION

Figure 1:
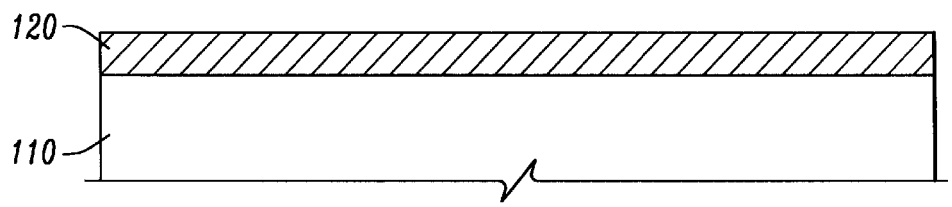
FIG. 1 illustrates a partial sectional view of an integrated circuit covered by the present invention at an intermediate fabrication step.

Referring initially to FIG. 1 there is illustrated a partial sectional view of a conventionally formed semiconductor substrate 110 on which a resistor, as covered by the present invention, can be formed. The substrate 110 may be a P-type silicon (Si), silicon dioxide ($SiO_2$), or other material known to those who are skilled in the art.

In one embodiment, a first resistor layer 120 is formed over the substrate 110 using conventional physical vapor deposition (PVD) or chemical vapor deposition (CVD) processes. In those embodiments where PVD is employed, the target will typically be a combination target consisting of a first metal silicide having the appropriate stoichiometric ratio of metal to silicon. In preferred embodiments, the metal will be tungsten silicide. However, other metals with similar metallurgical properties may also be used, for example, refractory silicides, such as tantalum silicide, molybdenum silicide, zirconium silicide and combinations thereof. The first resistor layer 120 uniquely has nitrogen incorporated therein. The nitrogen is preferably incorporated during the deposition of the metal silicide and the nitrogen flow is regulated during the deposition of the metal silicide to achieve the desired level of concentration. The amount of nitrogen incorporated into the first resistor layer 120 is dependent on the desired resistive value of the resistor to be formed and may, therefore, have a large concentration variance. However, in a preferred embodiment the concentration of nitrogen within the first resistor layer 120 may range from about 0.1% to about 30% and is preferably deposited by using a nitrogen flow ranging from about 5 sccm to about 100 sccm using a physical vapor deposition process. In such embodiments, the carrier gas used to sputter the majority of the first resistor silicide film is argon. Nitrogen is added to form the first resistor layer 120 according to resistivities required for the resistor. The gas flow rates depend on a variety of factors, such as equipment configuration, chamber size and volume, chamber pumping characteristics, mass flow control size for the gasses, cryopump capacity, chamber conductance, etc., all of which can be determined by those who are skilled in the art. The gas flow rate also depends on the deposition conditions, such as deposition power, pressure, temperature, metal to nitrogen ratio and silicon to nitrogen ratio desired in the resistor, which can also be determined by those who are skilled in the art. FIG. 6 illustrates a graph that shows how the sheet resistance of the device can be altered by changing the nitrogen flow.

Figure 2:
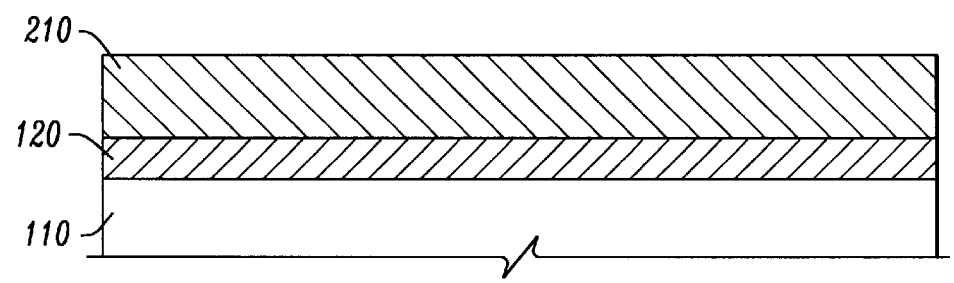
FIG. 2 illustrates the partial sectional view of the substrate and the first resistor layer illustrated in FIG. 1 and an additional second resistor layer formed, over the first resistor layer.

Turning now to FIG. 2, there is illustrated the substrate 110 and the first resistor layer 120 illustrated in FIG. 1, and an additional second resistor layer 210 formed over the first resistor layer 120. The second resistor layer 210 comprises the same metal silicide used to form the first resistor layer 120 with the exception that nitrogen is not incorporated into this layer. Alternatively, the metal silicide may be a different but compatible metal silicide as that used for the first resistor layer 120. Like the deposition of the first resistor layer 120, the second resistor layer 210 may also be deposited using conventional PVD or CVD processes. In fact, the first resistor layer 120 and the second resistor layer 210 may be deposited using the same deposition chamber. In such cases, the nitrogen is turning off during the formation of the second resistor layer 220.

Figure 3:
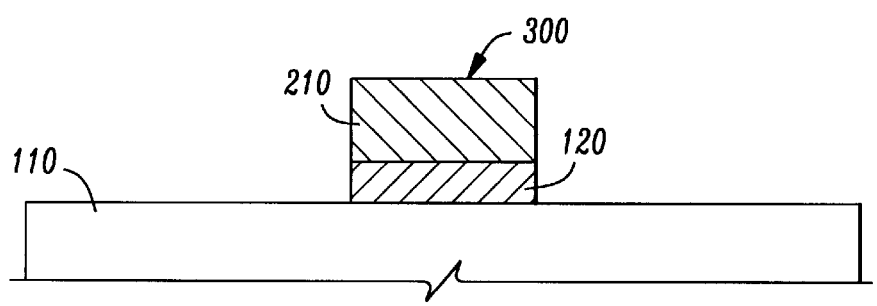
FIG. 3 illustrates the first resistor layer and the second resistor layer as illustrated in FIG. 2, patterned and etched to create a resistor structure.

FIG. 3 illustrates the first resistor layer 120 and the second resistor layer 210 as illustrated in FIG. 2, after a conventional patterning and etch back process, which create a resistor 300 as shown. The process by which the first and second layers 120, 210, may be etched back by any one of several wet and dry etching methods. However, one having skill in the art knows that the exact method used to etch back the first and second layers 120, 210, is not critical and that any method that creates the desired resistor 300, may be used. While, the resistor 300 that is illustrated as a positively formed feature, it should be realized and understood that the resistor 300 may also be formed by well known trenching and deposition methods as well.

As illustrated, the first resistor layer 120 has a first thickness and the second resistor layer 210 has a second thickness. The ratio between these two thickness can be adjusted to have a resistance value that is a function of a ratio of the thickness of the first resistor layer 120 to the thickness of the second resistor layer 210, and also relative to the concentration of the nitrogen present in the first resistor layer 120. In one embodiment, the thickness ratio may range from about 1:1 to about 1:5. In a preferred embodiment, however, the ratio is about 1:3. Furthermore, the described resistance values may range from about 10 ohms/sq. to about 1000 ohms/sq.

Traditionally the resistance value of the resistor was a function of the cross sectional area of the resistor. In such a case, the resistance value of the resistor was bound by the area available to in which to place such a resistor. The resistor 300, having nitrogen incorporated within as described, makes it possible for a resistor of a certain shape and size to have a predetermined resistance value, notwithstanding the space available.

Additionally, the nitrogen formed within the metal silicide, forms a part of the lattice structure of the metal silicide, and it is believed that this prevents diffusion or movement of the nitrogen during temperature or voltage changes that occur during the operation or formation of the resistor. This, of course, is a significant advantage over the diffused prior art resistor, where the diffused dopant can move within the resistor structure depending on the operating temperature or voltage, thereby causing a variance and unreliability in the resistivity of the resistor. As discussed above, such conventional art resistors are highly undesirable because they can cause the device in which the resistor is incorporated to function improperly. However, due to the advantages associated with the resistor covered within the scope of the present invention, the resistor can be used in precise circuits, such as analog circuits, with the knowledge that the any change in resistance value will be substantially inhibited or eliminated during usage variant operating temperatures and voltages.

Figure 4A:
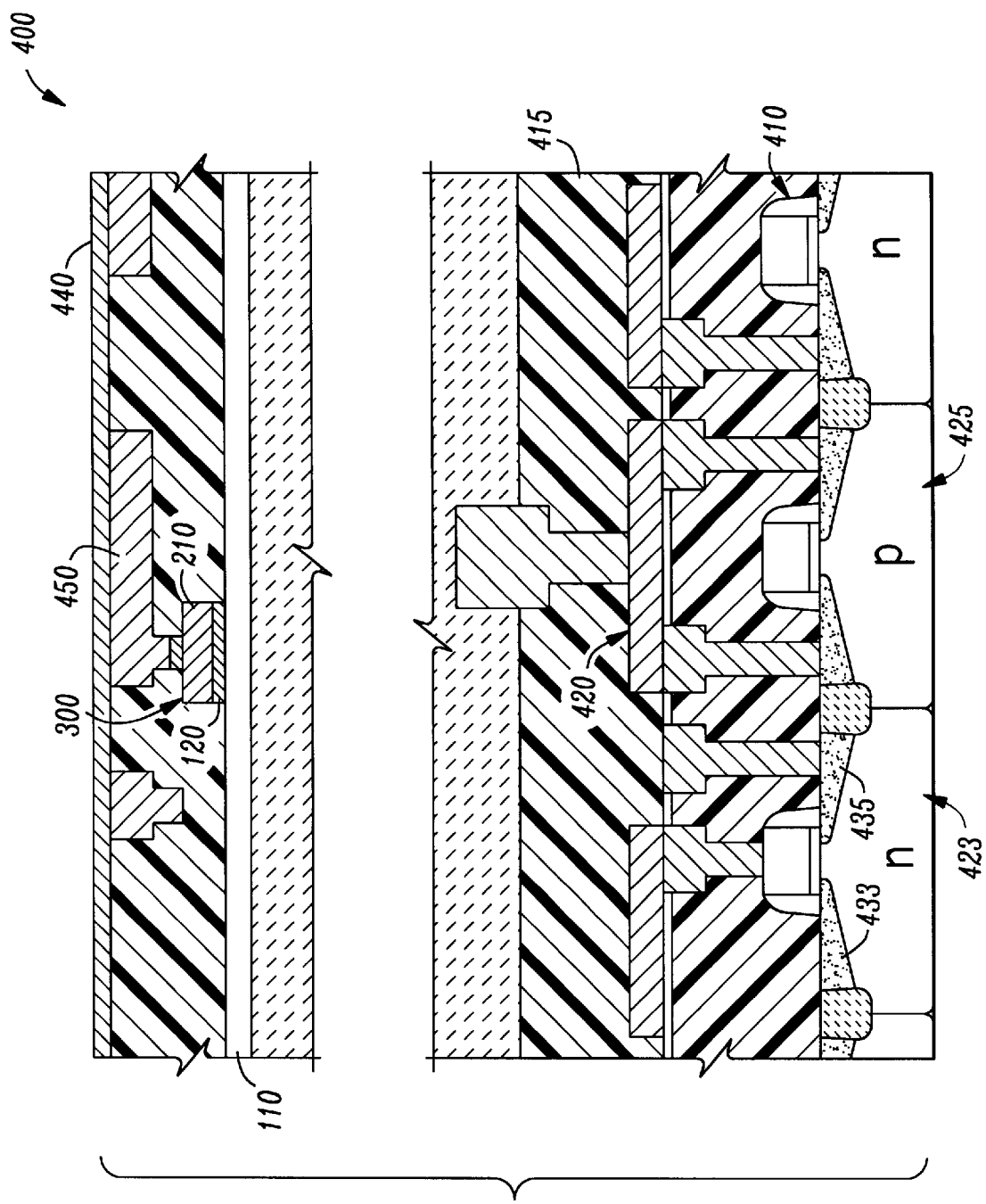
FIG. 4A illustrates a partial sectional view of a conventional integrated circuit which might employ the resistor of FIG. 3 therein.

Referring now to FIG. 4, there is illustrated a partial sectional view of a conventional integrated circuit 400 with the resistor 300 located within, and fabricated in accordance with the principles of the present invention. The integrated circuit 400 may be one of several semiconductor devices, such as a CMOS device, a BiCMOS device, a logic device, an analog device, a Bipolar device, a DRAM device or a FLASH device or other type of integrated circuit in which the resistor 300 may be desired. In a preferred embodiment illustrated in the present application, the resistor 300 is located within an analog circuit. As is well known, analog circuits require precise resistance values, and as such, the resistor 300 is especially useful because the resistor 300 may provide the precise resistivity required, to be used in such an analog circuit.

Shown in FIG. 4 are components of the conventional integrated circuit 400, including: transistors 410, dielectric layers 415 in which interconnect structures 420 are formed, the interconnect structures 420 connecting the transistors 410 to other areas of the integrated circuit 400, conventionally formed tubs, 423, 425, source regions 433 and drain regions 435, and a conventional capping layer 440.

Figure 4B:
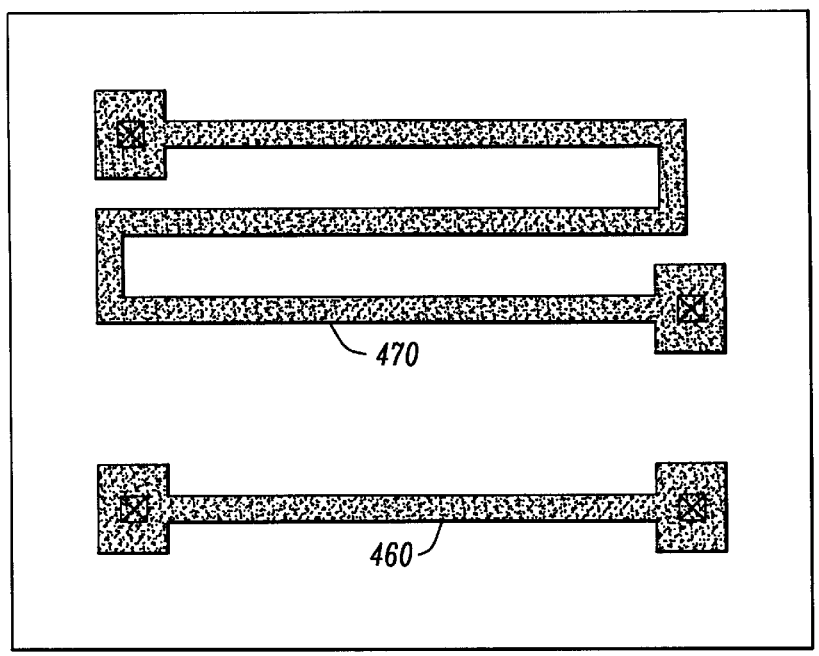
FIG. 4B illustrates a plan view of exemplary patterns in which the resistor of FIG. 3 may be formed on the substrate.

Also illustrated in FIG. 4 is the resistor 300 as illustrated in FIG. 3, located on a cutaway portion of the integrated circuit 400. As previously described, the resistor 300 comprises a first resistor layer 120 and a second resistor layer 210 and is located on the substrate 110, in this case formed on an interlevel $SiO_2$ dielectric layer. One having skill in the art should know, obviously, that while the resistor 300 is illustrated on an upper level of the integrated circuit 400, it may be located anywhere in the integrated circuit 400, even at the transistor level. If the resistor 300 is located on the transistor level, it may be formed upon a substrate 110 that comprises Si or another similar transistor level substrate material. Further illustrated, is an upper most interconnect 450 connecting the resistor 300 to the surface of the integrated circuit 400. The resistor 300, of course, may take a variety of geometric designs on the substrate. For example, the pattern may be a straight design as shown in example 460 or a serpentine design as shown in example 470, both of which are illustrated in FIG. 4B.

Figure 5:
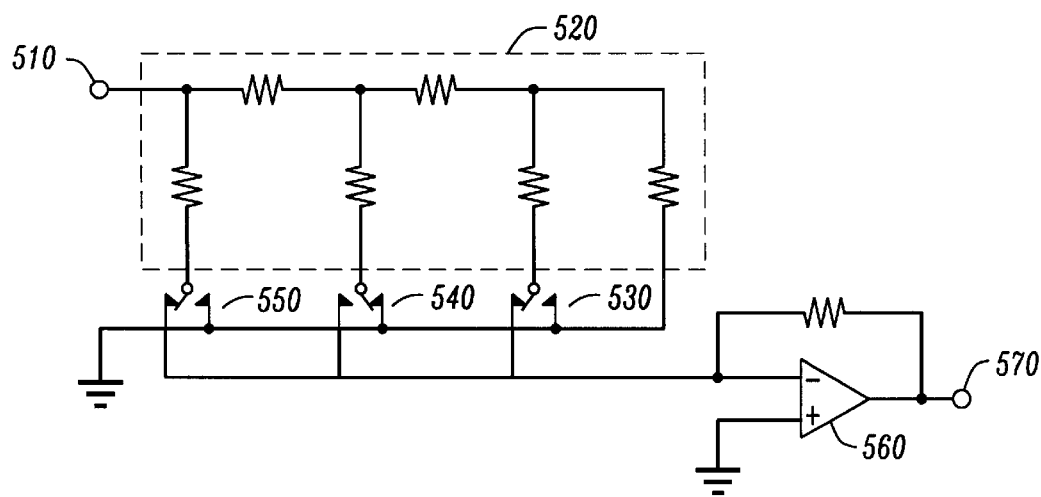
FIG. 5 illustrates a diagram of a digital-to-analog (D-to-A) converter in which the resistor of FIG. 3 might be employed.

Turning now to FIG. 5, illustrated is a diagram of a digital-to-analog (D-to-A) converter 500. Although one who is skilled in art knows how a D-to-A converter 500 works, a brief description describing the D-to-A converter 500 will be briefly set forth. As shown, the D-to-A converter 500 includes a voltage input 510, which is coupled to a plurality of resistors arranged in a resistor structure, sometimes called a resistor ladder network 520. The resistor ladder network 520 provides a number of voltage points corresponding to the bits to be converted. FIG. 5 illustrates a three bit converter 500 including a bit zero 530, a bit one 540 and a bit two 550. If a three bit number was to be converted, the least significant bit would be allocated to the bit zero 530, the next most significant bit would be allocated to the bit one 540 and the most significant bit would be allocated to the bit two 550. A bit having a value of one, will cause the switch to be biased to the left, as shown by the bit two 550, such that the voltage present at the bottom of the resistor on the left side is then passed on to the inverting input of the operational amplifier (Op-Amp) 560. In the example shown, the bit two 550 is set to one, the bit one 540 is set to zero and the bit zero is set to one, indicating a binary input of 1-0-1, or five. The voltage associated with the bit two 550 is added to the voltage associated with the bit zero 530 and sent to the Op-Amp 560 that produces an output voltage 570, which represents the sum of the two voltages. The output voltage 570 may have a fluctuating value between ground and the input voltage 510. If the resistance of the resistors withing the ladder network 520 fluctuates due to high operating temperatures or applied voltages, the converter 500 may not operate properly. However, if the resistor ladder network 520 includes the resistors as provided by the present invention, the chances of such a failure are substantially reduced because the unique resistor structure as described above provides for a resistor whose resistance is much less likely to be influenced by such variable operating conditions.

Although the present invention has been described in detail, those skilled in the art should understand that they can make various changes, substitutions and alterations herein without departing from the spirit and scope of the invention in its broadest form.

What is claimed is:

1. A resistor formed on a semiconductor substrate, comprising:
    a first resistor layer including a first metal silicide and nitrogen, formed on the substrate, the first layer having a first thickness and a concentration of nitrogen incorporated therein, the concentration of nitrogen being dependent on a desired resistive value of the resistor; and
    a second resistor layer including a second metal silicide, formed on the first resistor layer, the second resistor layer having a second thickness.

2. The resistor as recited in claim 1 wherein the resistor has a resistance that is a function of a ratio of the first thickness to the second thickness, and relative to the nitrogen concentration.

3. The resistor as recited in claim 2 wherein the ratio ranges from about 1:1 to about 1:5.

4. The resistor as recited in claim 3 wherein the ratio is about 1:3.

5. The resistor as recited in claim 1 wherein the first and second metal silicides are tungsten silicide.

6. The resistor as recited in claim 1 wherein the concentration of nitrogen ranges from about 0.1% to about 30%.

7. The resistor as recited in claim 1 wherein the resistive value ranges from about 10 ohms/sq. to about 1000 ohms/sq.

8. The resistor as recited in claim 1 wherein the first metal silicide is the same as the second metal silicide.

9. A method of forming a resistor on a semiconductor substrate, comprising:
    forming a first resistor layer including a first metal silicide and nitrogen on the substrate, the first resistor layer having a first thickness and a concentration of nitrogen incorporated therein, the concentration of nitrogen being dependent on a desired resistive value of the resistor; and
    forming a second resistor layer including a second metal silicide, on the first resistor layer, the second resistor layer having a second thickness.

10. The method as recited in claim 9 wherein forming a first resistor layer includes forming the first resistor layer in a presence of nitrogen gas having a flow rate ranging from about 5 sccm to about 100 sccm.

11. The method as recited in claim 9 wherein forming the first and second resistor layers includes forming the first and second resistor layers to a thickness wherein a ratio of the first thickness to the second thickness ranges from about 1:1 to about 1:5.

12. The method as recited in claim 11 wherein the ratio is about 1:3.

13. The method as recited in claim 9 wherein forming the first and second resistor layers includes forming the first and second resistor layers with tungsten silicide.

14. The method as recited in claim 9 wherein the first and second resistor layers are formed in a same physical vapor deposition chamber.

15. The method as recited in claim 9 wherein forming the first resistor layer includes forming the first resistor layer to have a nitrogen concentration that ranges from about 0.1% to about 30%.

16. The method as recited in claim 9 forming the resistor includes forming the resistor to have resistive value that ranges from about 10 ohms/sq. to about 1000 ohms/sq.

17. The method as recited in claim 9 further comprising:
    forming an integrated circuit on the substrate, including:
        forming transistors on the substrate, and
        forming interconnect structures on multiple levels within the integrated circuit to electrically connect the transistors in a pattern to form the integrated circuit.

18. The method as recited in claim 17 further including:
    forming a digital-to-analog converter that is electrically connected to the integrated circuit, including:
        forming a digital input that receives a sequence of bits representing a number;
        forming an analog conversion circuit that receives the sequence of bits from the input and associates an electrical characteristic with the sequence of bits based on values thereof, the analog conversion circuit including the resistor, and
        forming a summing circuit that adds the electrical characteristics to generate an analog value that is equivalent to the number.

* * * * *